US005625248A

United States Patent [19]

Saito et al.

[11] Patent Number: 5,625,248

[45] Date of Patent: Apr. 29, 1997

[54] PIEZOELECTRIC BUZZER

[75] Inventors: Shuho Saito; Isao Okada; Osamu Segawa; Toshiaki Yamashita, all of Nagaokakyo, Japan

[73] Assignee: Murata Manufacturing Co., Ltd., Japan

[21] Appl. No.: 322,934

[22] Filed: Oct. 13, 1994

[30] Foreign Application Priority Data

Oct. 15, 1993 [JP] Japan .................................... 5-258647

[51] Int. Cl.$^{6}$ ...................................................... H01L 41/08

[52] U.S. Cl. .......................... 310/324; 310/348; 310/355

[58] Field of Search .................................... 310/324, 348, 310/344, 354–356, 351–353; 381/190

[56] References Cited

U.S. PATENT DOCUMENTS

| | | | |
|---|---|---|---|
| 2,882,462 | 4/1959 | Zierdt, Jr. | 310/355 X |
| 4,230,383 | 10/1980 | Burnstein et al. | 310/324 X |
| 4,295,009 | 10/1981 | Weidler | 310/348 X |
| 4,420,706 | 12/1983 | Siebold et al. | 310/324 |
| 4,494,033 | 1/1985 | Morse et al. | 310/351 X |
| 4,965,483 | 10/1990 | Abe et al. | 310/324 |
| 5,021,701 | 6/1991 | Takahashi et al. | 310/324 X |
| 5,213,513 | 5/1993 | Brown et al. | 310/355 X |

FOREIGN PATENT DOCUMENTS

| | | |
|---|---|---|
| 333055 | 3/1989 | European Pat. Off. . |
| 2214031 | 8/1989 | United Kingdom . |

*Primary Examiner*—Mark O. Budd
*Attorney, Agent, or Firm*—Ostrolenk, Faber, Gerb & Soffen, LLP

[57] ABSTRACT

A piezoelectric buzzer includes a piezoelectric diaphragm stored in a case having a case body and a back cover, and a pair of metal terminals which are electrically connected to the piezoelectric diaphragm and drawn out from the back cover. The metal terminals have terminal drawing portions, terminal fixing portions which are arranged along an inner surface of the back cover, and connecting portions which are bent from inner ends of the terminal fixing portions so that the bent portions are substantially U-shaped as viewed from above while forward ends thereof are separated from the inner surface of the back cover and brought into contact with the piezoelectric diaphragm.

9 Claims, 4 Drawing Sheets

PIEZOELECTRIC BUZZER

BACKGROUND OF THE INVENTION

1. Field of the Invention

The present invention relates to a piezoelectric buzzer comprising a piezoelectric diaphragm which is preferably stored in a case, and more particularly, it relates to a piezoelectric buzzer having improved structures of metal terminals which are connected to the piezoelectric diaphragm and drawn out from the case.

2. Description of the Background Art

FIG. 1 is a sectional view showing an example of a conventional piezoelectric buzzer 1. The piezoelectric buzzer 1 has a case 2 which is made of synthetic resin, for example. This case 2 is provided with a case body 2*a* having an opening in its lower portion, and a back cover 2*b* which is fixed to the case body 2*a* for closing the opening in the lower portion.

The case 2 houses a piezoelectric diaphragm 3, which comprises a metal plate 3*a* and a piezoelectric vibrator 3*b* mounted to the lower surface of the plate 3*a*. The piezoelectric vibrator 3*b* is prepared by forming electrodes on both major surfaces of a piezoelectric ceramic plate. This piezoelectric diaphragm 3 is a unimorph piezoelectric vibrator.

A pair of metal terminals 4 and 5 are mounted on the back cover 2*b*. These metal terminals 4 and 5 have terminal drawing portions 4*a* and 5*a* which are drawn out from the case 2 through the back cover 2*b*, respectively. Further, the metal terminals 4 and 5 are bent at inner ends of the terminal drawing portions 4*a* and 5*a* along an inner surface of the back cover 2*b*, to define terminal fixing portions 4*b* and 5*b*, respectively. A pair of projections (not clearly shown in FIG. 1) are integrally provided with the back cover 2*b* on both sides of the terminal fixing portions 4*b* and 5*b*, respectively, and caulked for fixing the terminal fixing portions 4*b* and 5*b*, to the inner surface of the back cover 2*b*.

Inner ends of the terminal fixing portions 4*b* and 5*b* are upwardly bent so that connecting portions 4*c* and 5*c* are defined in forward ends of the upwardly bent portions. The connecting portion 4*c* is brought into contact with the electrode (not shown) which is formed on the lower surface of the piezoelectric vibrator 3*b*, to be thereby electrically connected to the piezoelectric vibrator 3*b*. The electrode provided on the upper surface of the piezoelectric vibrator 3*b* is electrically connected to the metal plate 3*a*, while the connecting portion 5*c* of the metal terminal 5 is brought into contact with the metal plate 3*a* so that the metal terminal 5 is electrically connected with the metal plate 3*a*.

Each of the metal terminals 4 and 5 may be replaced by a metal terminal 6 having a linearly extending terminal drawing portion 6*a*, which is bent on an upper end to define a connecting portion 6*b*, as shown in FIG. 2. In this metal terminal 6, the upper portion of the linearly extending terminal drawing portion 6*a* is embedded in the back cover 2*b* of the piezoelectric buzzer i shown in FIG. 1, to be thereby fixed to the back cover 2*b*. Further, the forward end of the connecting portion 6*b* is brought into contact with the piezoelectric vibrator 3*b* or the metal plate 3*a*.

However, it is impossible to provide a relatively larger area for fixing the metal terminal 6 to the inner surface of the back cover 2*b*. If the back cover 2*b* is deformed at the portion fixed with the metal terminal 6 due to heat application during soldering, therefore, the contact position or the contact pressure may be changed at the portion of the metal terminal 6 which is in contact with the piezoelectric diaphragm 3. Consequently, the characteristics of the piezoelectric buzzer 1 may disadvantageously be deteriorated.

This problem can be solved in the metal terminals 4 and 5 shown in FIG. 1, which are provided with the terminal fixing portions 4*b* and 5*b* along the inner surface of the back cover 2*b*. However, the metal terminals 4 and 5 are bent to be substantially U-shaped at the forward ends of the terminal fixing portions 4*b* and 5*b* thereby defining the connecting portions 4*c* and 5*c*, and hence it is necessary to sufficiently increase the distance between the inner surface of the back cover 2*b* and the piezoelectric diaphragm 3. Consequently, it is impossible to reduce the vertical length of the piezoelectric buzzer 1, and hence the the thickness of the buzzer 1 cannot be reduced.

Further, it is necessary to bend the metal terminals 4 and 5 at the forward ends of the terminal fixing portions 4*b* and 5*b* at considerable angles for reducing the relative angles between the contact portions 4*c* and 5*c* and the terminal fixing portions 4*b* and 5*b*. Consequently, work hardening is easily caused in the bent portions, to reduce spring properties of the metal terminals 4 and 5 in these portions.

Further, spring pressures caused by the bent portions may be increased to suppress vibration of the piezoelectric diaphragm 3, leading to deterioration of the characteristics. In order to solve this problem, the diameters of the metal terminals 4 and 5 may be reduced for lowering the spring pressures.

When the diameters are reduced, however, the metal terminals 4 and 5 are reduced in bending strength such that the terminals may be bent in undesirable directions in handling. In this case, it is difficult to arrange the metal terminals 4 and 5 to have desired shapes in the piezoelectric buzzer 1.

SUMMARY OF THE INVENTION

An object of at least one of the preferred embodiments of the present invention is to provide a piezoelectric buzzer having metal terminals which do not require extremely careful handling during manufacturing and require substantially no change of contact pressures and contact positions between the metal terminals and a piezoelectric diaphragm upon application of heat during soldering, to thereby provide stable characteristics and relatively reduced vertical length.

At least one preferred embodiment of the present invention is directed to a piezoelectric buzzer comprising a piezoelectric diaphragm, a case for storing the piezoelectric diaphragm which is provided with a case body having an opening and a back cover fixed to the case body for closing its opening, and a pair of metal terminals which are fixed to the back cover to be electrically connected to the piezoelectric diaphragm and drawn out from the case. Each of the metal terminals has a terminal drawing portion outwardly extending from the case through the back cover, a terminal fixing portion which is bent with respect to the terminal drawing portion at an end provided on an inner surface of the back cover and arranged along the inner surface of the back cover, and a connecting portion which is bent from an inner end of the terminal fixing portion so that the bent portion is substantially U-shaped as viewed from above. A forward end of the connecting portion is separated from the inner surface of the back cover, and brought into contact with the piezoelectric diaphragm.

In the piezoelectric buzzer according to at least one of the preferred embodiments of the present invention, it is possible to reliably fix the metal terminals to the back cover, due to the terminal fixing portions which are bent with respect to the terminal drawing portions and arranged along the inner surface of the back cover. More specifically, it is possible to reliably fix the metal terminals to the back cover by providing caulking portions on both sides of the terminal fixing portions integrally with the back cover, for example, and caulking the terminal fixing portions.

Further, the substantially U-shaped bent portions of the metal terminals are bent to be substantially U-shaped as viewed from above. Thus, the metal terminals have no superposed portions along the vertical direction, whereby the distances between forward ends of the connecting portions and the terminal fixing portions of the metal terminals can be relatively reduced. In addition, the metal terminals are bent from the terminal fixing portions to be substantially U-shaped as viewed from above, i.e., substantially along the direction of a horizontal plane, whereby it is not necessary to provide a relatively extreme bend in the terminals. Thus, work hardening is hardly caused in the metal terminals, and hence it is possible to set spring pressures of the forward ends which are in contact with the piezoelectric diaphragm at optimum values.

According to at least one of the preferred embodiments of the present invention, the portions of the metal terminals which are located between the back cover and the piezoelectric diaphragm are bent to be substantially U-shaped, whereby the contact portions defined on the forward ends of the metal terminals are provided with proper spring properties. Further, the substantially U-shaped bent portions are formed to be substantially U-shaped as viewed from above. Thus, the distance between the piezoelectric diaphragm and the inner surface of the back cover can be reduced, thereby reducing the vertical length of the piezoelectric buzzer.

Further, it is not necessary to increase the bending angles of the U-shaped bent portions, which are substantially U-shaped as viewed from above, in order to reduce the vertical length of the piezoelectric buzzer. Thus, it is possible to reduce the vertical length of the piezoelectric buzzer while keeping proper spring properties of the metal terminals. Thus, the metal terminals can be formed to have optimum spring properties, whereby it is possible to provide a piezoelectric buzzer having stable characteristics.

Further, the length of the terminal fixing portions can be increased, whereby the length of the portions for fixing the back cover and the metal terminals can be further increased. Therefore, the metal terminals are hardly displaced upon application of heat during soldering or the like.

In accordance with the invention, the piezoelectric buzzer comprises:

A) a piezoelectric diaphragm;

B) a case for housing said diaphragm, said case having a side whose inner surface extends substantially along a first plane;

C) a first metal terminal fixed to said case and being electrically connected to said piezoelectric diaphragm, said first metal terminal including:

(1) a terminal drawing portion extending through said side of said case in a direction which is substantially perpendicular to said first plane;

(2) a terminal fixing portion coupled to said terminal drawing portion and supported by said side of said case, said terminal fixing portion extending along a substantially straight line which lies in a second plane which is perpendicular to said first plane; and (3) a terminal connecting portion coupled to said terminal fixing portion and extending away from said first plane along a substantially straight line which lies in a third plane which is perpendicular to said first plane and which forms an acute angle with respect to said second plane;

D) a second metal terminal fixed to said case and being electrically connected to said piezoelectric diaphragm, said second metal terminal including:

(1) a terminal drawing portion extending to said side of said case in a direction which is substantially perpendicular to said first plane;

(2) a terminal fixing portion coupled to said terminal drawing portion of said second metal terminal and supported by said side of said case, said terminal fixing portion of said second metal terminal extending along a substantially straight line which lies in a fourth plane which is perpendicular to said first plane; and (3) a terminal connecting portion coupled to said terminal fixing portion of said second metal terminal and extending away from said first plane along a substantially straight line which lies in a fifth plane which is perpendicular to said first plane and which forms an acute angle with respect to said fourth plane.

The foregoing and other objects, features, aspects and advantages of the preferred embodiments of the present invention will become more apparent from the following detailed description of the preferred embodiments of the present invention when taken in conjunction with the accompanying drawings.

DESCRIPTION OF THE PREFERRED EMBODIMENTS

Figure 3:
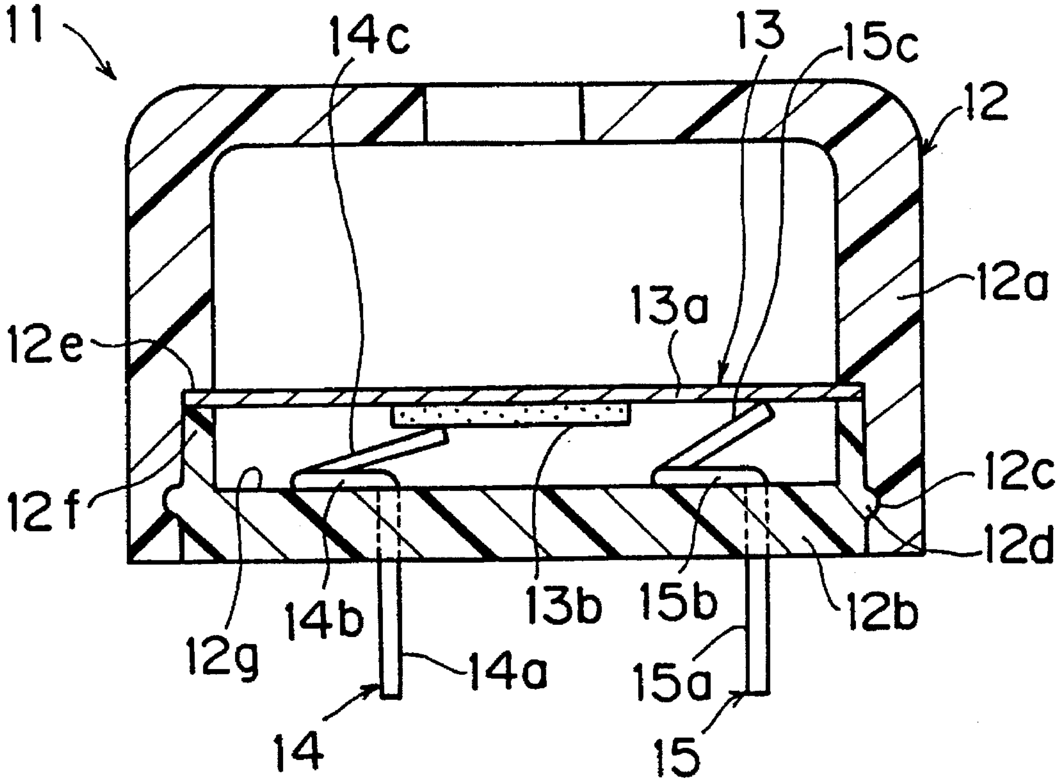
FIG. 3 is a sectional view showing a piezoelectric buzzer according to a preferred embodiment of the present invention.

FIG. 3 is a sectional view showing a piezoelectric buzzer 11 according to a preferred embodiment of the present invention. The piezoelectric buzzer 11 has a case 12 which is preferably made of synthetic resin. This case 12 has a cylindrical case body **12*a* having an opening in a lower portion of the case body 12*a*, and a back cover 12*b* which is mounted on the case body 12*a* to close the opening in the lower portion of the case body 12*a***.

As shown in FIG. 3, a circumferentially extending groove **12*c* is formed in an inner wall portion of the case body 12*a* which is fixed with the back cover 12*b*, while an annular projection 12*d* is provided on an outer peripheral wall of the back cover 12*b* to engage with the grooves 12*c*. Therefore, it is possible to fix the back cover 12*b* to the case body 12*a*** by inserting the same into the lower opening of the case 12 under pressure so that the annular projection 12*d* engages with the groove 12*c*. Alternatively, the back cover 12*b* can be fixed to the case body 12*a* through an adhesive or the like.

The case 12 stores a discoidal piezoelectric diaphragm 13 comprising a discoidal metal plate 13*a* and a piezoelectric vibrator 13*b* which is preferably pasted to its lower surface through a conductive adhesive. The piezoelectric vibrator 13*b* comprises a piezoelectric ceramic plate and an electrode (not shown) which is formed on its lower surface. Another electrode which is provided on an upper surface of the piezoelectric vibrator 13*b* is defined by the metal plate 13*a*. Thus, the piezoelectric diaphragm 13 is a unimorph piezoelectric diaphragm.

Alternatively, the unimorph piezoelectric diaphragm 13 may be replaced by a bimorph piezoelectric diaphragm.

The piezoelectric vibrator 13 is held and fixed between a step 12*e* which is provided at an intermediate position of the case body 12*a* and an upper end surface 12*f* of the back cover 12*b*. Namely, the piezoelectric diaphragm 13 is located and fixed in a position upward beyond an inner surface 12*g* of the back cover 12*b*.

A pair of metal terminals 14 and 15 are fixed to the back cover 12*b*. These metal terminals 14 and 15 have terminal drawing portions 14*a* and 15*a* which are drawn out from the case 12 through the back cover 12*b*, respectively. The metal terminals 14 and 15 are bent at inner ends of the terminal drawing portions 14*a* and 15*a* along the inner surface 12*g* of the back cover 12*b*, respectively, thereby defining terminal fixing portions 14*b* and 15*b*.

Figure 4:
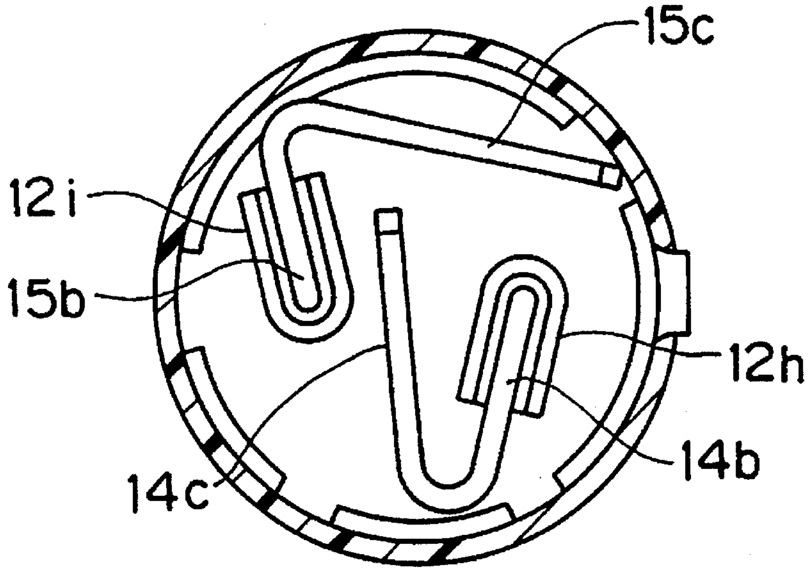
FIG. 4 is a plan sectional view of the piezoelectric buzzer according to the preferred embodiment showing an upper portion of a case body in a fragmented manner.

As clearly understood from FIG. 4 which is a plan sectional view showing an upper portion of the case body 12*a* in a fragmented manner, peripheries of the terminal fixing portions 14*b* and 15*b* are enclosed by substantially U-shaped projections 12*h* and 12*i*. The projections 12*h* and 12*i* are caulked so as to fix the terminal fixing portions 14*b* and 15*b*, respectively.

The U-shaped projections 12*h* and 12*i*, which are formed to enclose the peripheries of the terminal fixing portions. 14*b* and 15*b* in this preferred embodiment, may alternatively be replaced by projections extending on both sides of the terminal fixing portions 15*b* and 15*b* and disposed substantially parallel to the portions 15*a* and 15*b*.

Referring again to FIG. 3, connecting portions 14*c* and 15*c* are formed on forward end sides of the terminal fixing portions 14*b* and 15*b* of the metal terminals 14 and 15, respectively. These connecting portions 14*c* and 15*c* are brought into contact with and electrically connected to the piezoelectric diaphragm 13 on forward ends thereof, respectively. The connecting portion 14*c* is brought into contact with the electrode (not shown) provided on the lower surface of the piezoelectric vibrator 13*b*, while the connecting portion 15*c* is brought into contact with the lower surface of the metal plate 13*a*.

The connecting portions 14*c* and 15*c* of the metal terminals 14 and 15 are formed by horizontally bending the metal terminals 14 and 15 from the forward ends of the terminal fixing portions 14*b* and 15*b* so that the bent portions upwardly extend on forward end sides. The metal terminals 14 and 15 are bent to be substantially U-shaped as viewed from above, thereby defining the connecting portions 14*c* and 15*c*, respectively.

Each of the terminals 14, 15 include a terminal drawing portion, a terminal fixing portion and a terminal connecting portion. These three portions lie in respective planes which can be best understood with respect to FIG. 7.

Figure 7:
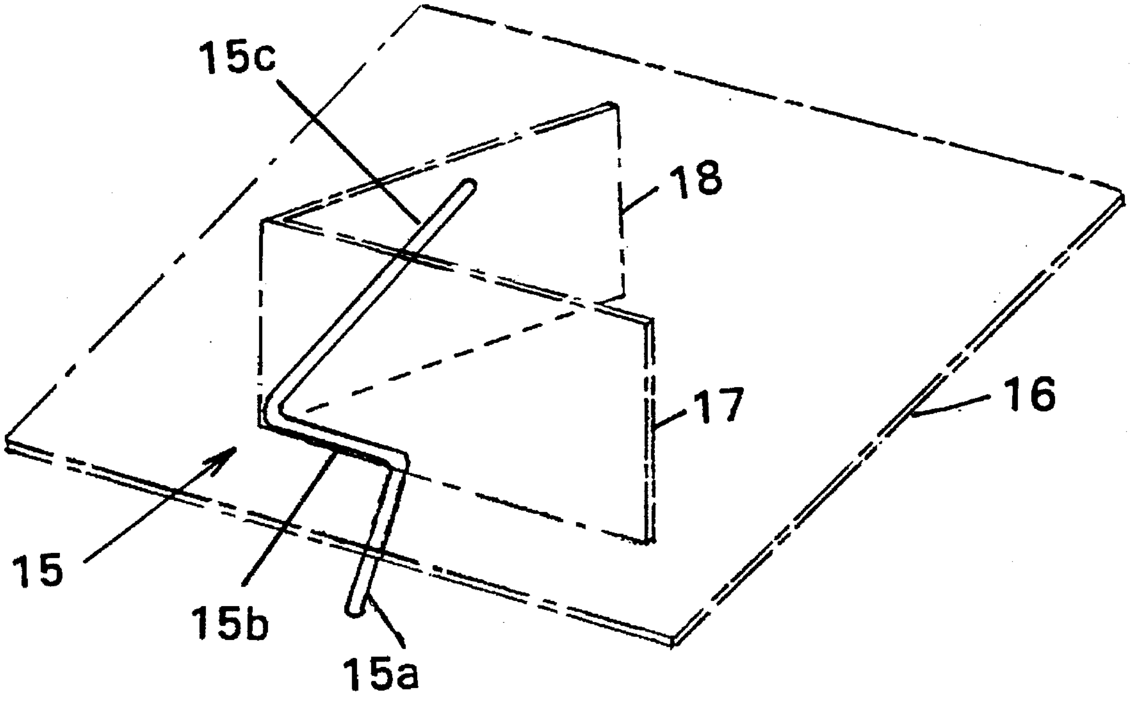
FIG. 7 is a perspective view of one of the metal terminals of the invention.

FIG. 7 illustrates the relative position of the three portions of metal terminal 15. As shown therein, the terminal drawing portion 15*a* extends in a direction which is substantially perpendicular to a first plane 16 which corresponds to the inner surface 12*g* of the back cover 12*b* of the case 12. The terminal fixing portion 15*b* is coupled to the terminal drawing portion 15*a* and extends along a substantially straight line which lies in a second plane 17 which is perpendicular to the first plane 16. Finally, the terminal connecting portion 15*c* is coupled to the terminal fixing portion 15*b* and extends away from the first plane 16 along a substantially straight line which lies in a third plane 18. The third plane 18 is perpendicular to the first plane 16 and forms an acute angle with respect to the second plane 17.

The second metal terminal 14 has a terminal drawing portion, a terminal fixing portion and a terminal connecting portion which have a similar relationship to those of the metal terminal 15.

Figure 5:
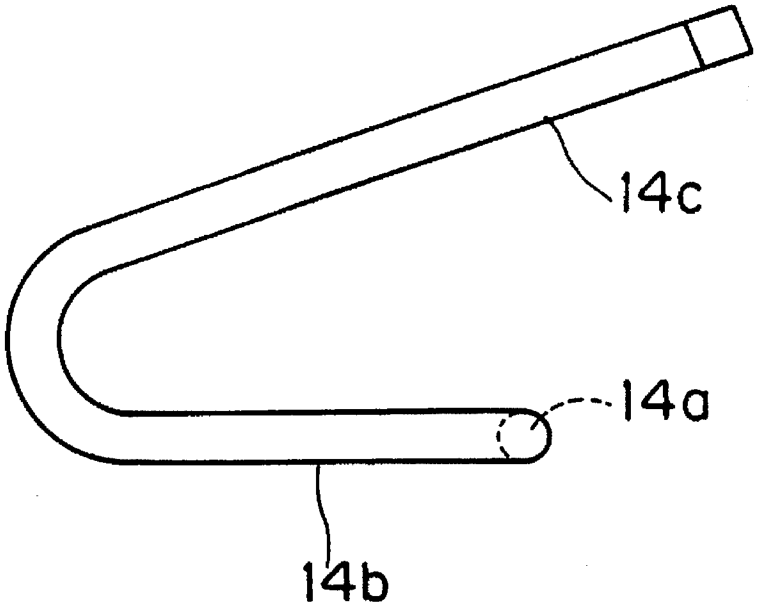
FIG. 5 is a top plan view showing a metal terminal.
Figure 6:
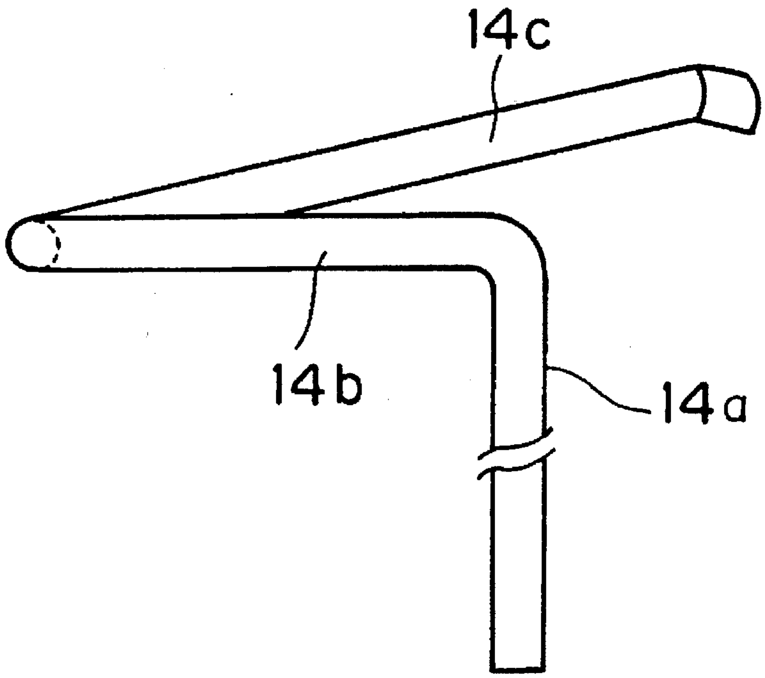
FIG. 6 is a front elevational view of the metal terminal.

As shown in FIGS. 5 and 6 in an enlarged manner, the metal terminal 14 is fixed at the forward end of the horizontally extending terminal fixed portion 14*b* to be gradually upwardly inclined toward the forward end of the connecting portion 14*c*, thereby defining the substantially U-shaped portion.

Figure 1:
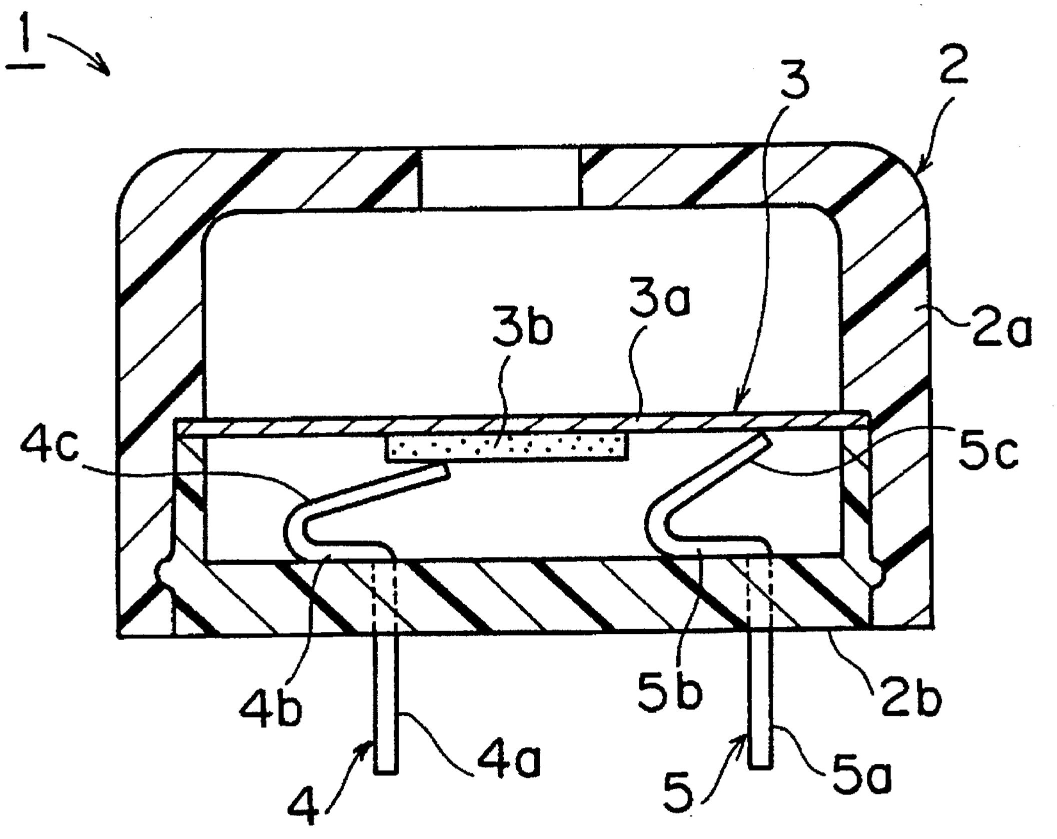
FIG. 1 PRIOR ART
FIG. 1 is a sectional view showing an example of a conventional piezoelectric buzzer.
Figure 2:
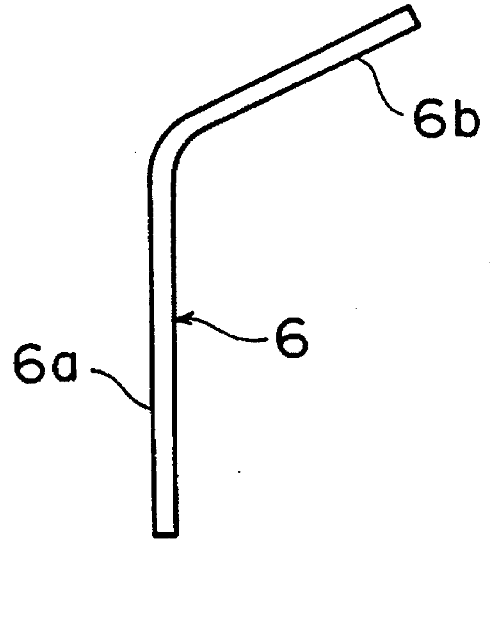
FIG. 2 is a front elevational view showing another example of a metal terminal employed for the conventional piezoelectric buzzer.

In the metal terminal 4 of the conventional piezoelectric buzzer 1 shown in FIG. 1, the substantially U-shaped bent portion defined between the connecting portion 4*c* and the terminal fixing portion 4*b* is formed in a plane extending in the vertical direction. Therefore, it is necessary to provide a relatively large distance between the metal plate 3 and the back cover 2*b*, leading to hindrance of reduction in vertical length of the piezoelectric buzzer 1.

In the piezoelectric buzzer 11 according to at least one preferred embodiment of the present invention, on the other hand, the substantially U-shaped bent portion is formed to extend in the horizontal direction and is located in a plane slightly inclined from the horizontal direction so that the bent portion is substantially U-shaped as viewed from above, whereby the distance between the piezoelectric diaphragm 13 and the inner surface 12*g* of back cover 12*b* can be reduced as compared with the prior art shown in FIG. 1. Thus, it is possible to reduce the vertical length of the piezoelectric buzzer 11.

Also when the vertical length of the piezoelectric buzzer 11 is reduced, it is not necessary to increase the bending angle of each U-shaped bent portion since the U-shaped bent portion is arranged to be positioned in a plane including the horizontal direction and the plane slightly inclined from the horizontal direction. While it is necessary to increase the bending angle of each substantially U-shaped portion in the prior art shown in FIG. 1 in order to reduce the vertical length of the piezoelectric buzzer 1, the bending angle of each substantially U-shaped bent portion may not be increased in this preferred embodiment. Thus, it is possible to provide the metal terminals 14 and 15 with proper spring properties, without reducing diameters thereof. Consequently, it is possible to reduce the vertical length of the piezoelectric buzzer 11 with no deterioration of its characteristics.

Further, it is possible to increase the lengths of the projections 12*h* and 12*j* for caulking which are provided on the back cover 12*b*, since the terminal fixing portions 14*b* and 15*b* can be provided in sufficient lengths. Thus, the metal terminals 14 and 15 are hardly displaced upon application of heat in soldering.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric buzzer, comprising:

A) a piezoelectric diaphragm;

B) a case for housing said diaphragm, said case having a side whose inner surface extends along a first plane;

C) a first metal terminal fixed to said case and being electrically connected to said piezoelectric diaphragm, said first metal terminal including:

(1) a terminal drawing portion extending through said side of said case in a direction which is substantially perpendicular to said first plane;

(2) a terminal fixing portion coupled to said terminal drawing portion and supported by said side of said case, said terminal fixing portion extending along a substantially straight line which lies in a second plane which is perpendicular to said first plane; and (3) a terminal connecting portion coupled to said terminal fixing portion and extending away from said first plane along a substantially straight line which lies in a third plane which is perpendicular to said first plane and which forms an acute angle with respect to said second plane;

D) a second metal terminal fixed to said case and being electrically connected to said piezoelectric diaphragm, said second metal terminal including:

(1) a terminal drawing portion extending through said side of said case in a direction which is substantially perpendicular to said first plane;

(2) a terminal fixing portion coupled to said terminal drawing portion of said second metal terminal and supported by said side of said case, said terminal fixing portion of said second metal terminal extending along a substantially straight line which lies in a fourth plane which is perpendicular to said first plane; and (3) a terminal connecting portion coupled to said terminal fixing portion of said second metal terminal and extending away from said first plane along a substantially straight line which lies in a fifth plane which is perpendicular to said first plane and which forms an acute angle with respect to said fourth plane.

2. A piezoelectric buzzer in accordance with claim 1, wherein said case includes a back cover and said side of said case is defined by an inner surface of said back cover which inner surface has projections disposed along said terminal fixing portions of said metal terminals.

3. A piezoelectric buzzer in accordance with claim 2, wherein said projections are substantially U-shaped, and arranged to enclose said terminal fixing portions of said metal terminals.

4. A piezoelectric buzzer in accordance with claim 1, wherein said piezoelectric diaphragm is a unimorph piezoelectric diaphragm having a metal plate and a piezoelectric vibrator being mounted on one surface of said metal plate.

5. A piezoelectric buzzer in accordance with claim 4, wherein said connecting portion of one of said metal terminals contacts said piezoelectric vibrator, and said connecting portion of the other of said metal terminals is connected to said metal plate.

6. A piezoelectric buzzer in accordance with claim 1, wherein said second and fourth planes are different from each other.

7. A piezoelectric buzzer in accordance with claim 6, wherein said third and fifth planes are different from one another.

8. A piezoelectric buzzer in accordance with claim 1, wherein said third and fifth planes are different from one another.

9. A piezoelectric buzzer in accordance with claim 1, wherein said terminal connecting portion of said first and second metal terminals are each bent from an inner end of said terminal fixing portion of said first and second metal terminals, respectively, to define a bent portion that is substantially U-shaped as viewed along said first plane.

* * * * *